(12) United States Patent
Yoshida

(10) Patent No.: US 6,265,772 B1
(45) Date of Patent: Jul. 24, 2001

(54) STACKED SEMICONDUCTOR DEVICE

(75) Inventor: Yuichi Yoshida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/332,997

(22) Filed: Jun. 15, 1999

(30) Foreign Application Priority Data

Jun. 17, 1998 (JP) ................................................. 10-170348

(51) Int. Cl.[7] .................................................. H01L 23/34
(52) U.S. Cl. ...................... 257/712; 257/712; 257/720; 438/15; 438/106; 438/121; 361/719; 361/720; 361/729; 361/736; 361/748; 361/752
(58) Field of Search .................................. 361/719–763; 257/712, 720, 725; 438/106, 121, 15

(56) References Cited

U.S. PATENT DOCUMENTS

| | | | |
|---|---|---|---|
| 5,825,628 | * 10/1998 | Garbelli et al. | 361/763 |
| 5,847,929 | * 12/1998 | Bernier et al. | 361/719 |
| 5,861,322 | * 1/1999 | Caillat et al. | 438/107 |
| 5,870,289 | * 2/1999 | Tokuda et al. | 361/779 |
| 5,935,687 | * 8/1999 | Davidson et al. | 428/195 |
| 5,963,795 | * 10/1999 | Schneider et al. | 438/122 |
| 5,973,396 | * 10/1999 | Farnworth | 257/698 |
| 6,014,313 | * 1/2000 | Hesselbom | 361/704 |
| 6,072,690 | * 6/2000 | Farooq et al. | 361/321 |
| 6,098,282 | * 8/2000 | Frankeny et al. | 29/852 |

FOREIGN PATENT DOCUMENTS

| | | |
|---|---|---|
| 63-14359 | 2/1988 | (JP) . |
| 4-99051 | 3/1992 | (JP) . |
| 5-29533 | 2/1993 | (JP) . |
| H6-85427 | 3/1994 | (JP) . |
| 8-167691 | 6/1996 | (JP) . |
| H8-204072 | 8/1996 | (JP) . |
| 8-279572 | 10/1996 | (JP) . |
| 8-330352 | 12/1996 | (JP) . |
| 9-199629 | 7/1997 | (JP) . |

* cited by examiner

Primary Examiner—Matthew Smith
Assistant Examiner—Granvill D Lee
(74) Attorney, Agent, or Firm—Sughrue, Mion, Zinn, Macpeak & Seas, PLLC

(57) ABSTRACT

The object of the present invention is to provide a stacked semiconductor device which can diffuse heat generated by the semiconductor chip in the module substrate, other semiconductor chips, the mother board, and the radiator plate, and can prevent needless increases in the temperature of an operating semiconductor chip; in order to achieve this object, the stacked semiconductor device of the present invention comprises a mother board and a module-stacked body mounted on the mother board, the module-stacked body comprising staked two or more modules each of which comprises a module substrate and a semiconductor chip mounted to the module substrate, wherein at least one radiator hole is formed in each of the module substrates and the mother board so that the radiator hole faces to the semiconductor chips.

10 Claims, 5 Drawing Sheets

STACKED SEMICONDUCTOR DEVICE

BACKGROUND OF THE INVENTION

1. Field of the Invention

The present invention relates to a stacked semiconductor device having an improved structure for heat dissipation.

This application is based on patent application No. Hei 10-170348 filed in Japan, the content of which is incorporated herein by reference.

2. Description of the Related Art

Ordinary stacked semiconductor devices comprise semiconductor chips 11a and 11b, module substrates 12a and 12b, and a mother board 14 as shown in FIG. 9. The semiconductor chip 11a is flip-chip mounted to the module substrate 12a, whereby a module is obtained. Similarly, the semiconductor chip 11b is flip-chip mounted to the module substrate 12b, whereby another module is obtained. Module-stacked body is obtained by stacking these modules. The module-stacked body is stacked on the mother board 14 via connectors 13 as shown in FIG. 9.

The connectors 13 are positioned in the spaces between the module substrates 12a and 12b, and the module substrate 12a and the mother board 14. Therefore, the semiconductor chip 11a does not contact the module substrate 12b, and the semiconductor chip 11b also does not contact the mother board 14. When the semiconductor chip 11a contacts the module substrate 12b, and the semiconductor chip 11b contacts the mother board 14, the mother board 14 expands due to heat generated by the semiconductor chips 11a and 11b, or by rising ambient temperature. The semiconductor chips 11a and 11b are then subjected to excessive pressure, whereby the semiconductor chips 11a and 11b may be damaged. In order to prevent such damage, only one surface of the semiconductor chip 11a contacts the module substrate 12a, and only one surface of the semiconductor chip 11b contacts the module substrate 12b. That is, there is a space between the other surface of the semiconductor chip 11a and the module substrate 12b. There is also a space between the other surface of the semiconductor chip 11b band the mother board 14.

It is believed that air flows into the spaces; therefore, most of heat generated by the semiconductor chips 11a and 11b can be dissipated. Therefore, ordinary semiconductor devices do not comprise special structures for heat dissipation.

Another ordinary semiconductor device comprises the semiconductor chips 11a and 11b mounted on the module substrates 12a and 12b as shown in FIG. 10. That is, the semiconductor chip 11b is mounted on the module substrate 12b so that the semiconductor chip 11b does not face toward the mother board 14. In order to prevent the damage to the semiconductor chips 11a and 11b by heat, only one surface of the semiconductor chip contacts the module substrate. That is, there is a space between the semiconductor chip 11b and the module substrate 12a.

As described above, most of heat generated by the semiconductor chip is dissipated in the each module; therefore, heat dissipation efficiency of the semiconductor device is low. As a result, the temperature of the operating semiconductor chip becomes high and the semiconductor chip may malfunction. In some cases, the semiconductor chip may be damaged.

It is therefore an object of the present invention to provide a stacked semiconductor device which has an improved structure for heat dissipation and can operate stably semiconductor chips.

SUMMARY OF THE INVENTION

The present invention relates to a stacked semiconductor device which can transfer heat generated by the operating semiconductor chip to the other semiconductor chip and the module substrate, or can dissipate heat. Therefore, heat dissipation efficiency of the semiconductor device is improved, whereby the temperature rise of the operating semiconductor chip can be prevented. As a result, the stacked semiconductor device of the present invention can prevent the malfunctions and damage of the semiconductor chips. Specifically, the stacked semiconductor device of the present invention comprising a mother board and a module-stacked body mounted on the mother board, the module-stacked body comprising stacked two or more modules each of which comprises a module substrate and a semiconductor chip mounted to the module substrate, wherein at least one radiator hole is formed in each of the module substrates and the mother board so that the radiator hole faces to the semiconductor chips.

DETAILED DESCRIPTION OF THE PREFERRED EMBODIMENTS

The preferred stacked semiconductor devices of the present invention will be explained below. Moreover, the first to the fourth stacked semiconductor devices comprise the semiconductor chips 1a and 1b provided to the lower surfaces of the module substrates 2a and 2b. That is, the mother board 4, the semiconductor chip, and the module substrate are stacked in order at the bottom in these semiconductor devices.

In contrast, the fifth to the eighth stacked semiconductor devices comprise the semiconductor chips 1a and 1b provided to the top surfaces of the module substrates 2a and 2b. That is, the mother board 4, the module substrate, and the semiconductor chip are stacked in order at the bottom in these semiconductor devices.

Figure 1:
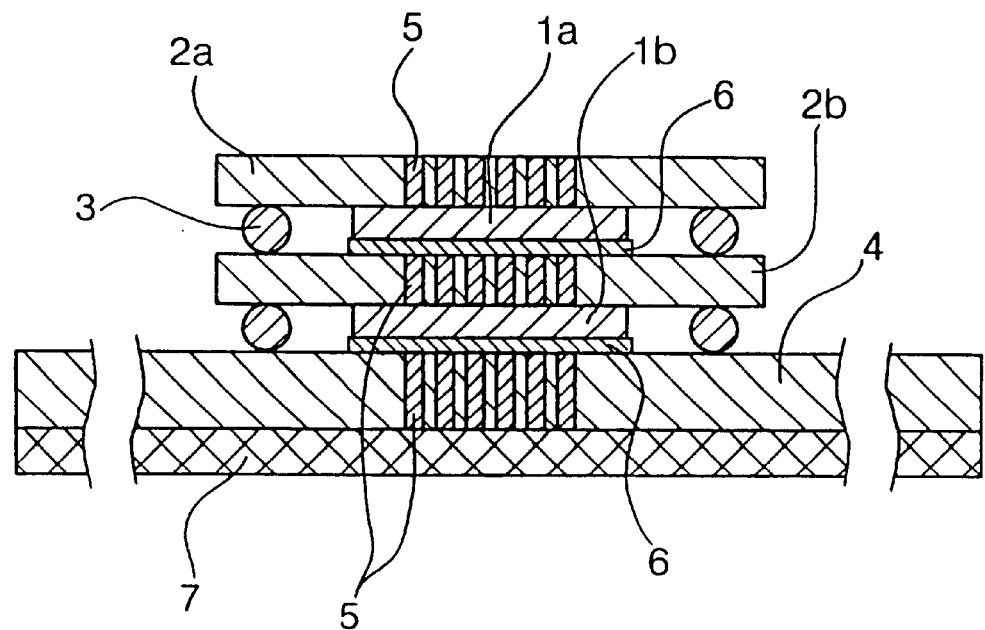
FIG. 1 is a cross-sectional view showing the first preferred embodiment of a stacked semiconductor device of the present invention.

FIG. 1 shows the first preferred embodiment of the stacked semiconductor device of the present invention. In FIG. 1, reference numbers 1a and 1b denote the semiconductor chips, reference numbers 2a and 2b denote the module substrates, and reference number 4 denotes the mother board. The semiconductor chip 1a is flip-chip mounted to the module substrate 2a, whereby a module is obtained. Similarly, the semiconductor chip 1b is flip-chip mounted to the module substrate 2b, whereby another module is obtained. A module-stacked body is obtained by stacking these modules. The module-stacked body is stacked on the mother board 4 via connectors (solder balls) 3 so that the semiconductor chip 1b contacts the lower surface of the module substrate 2b as shown in FIG. 1. That is, the module-stacked body is stacked on the mother board 4 so that the semiconductor chip 1b faces toward the mother board 4.

For example, the module substrates 2a and 2b, and the mother board 4 are printed boards or the boards made of ceramics such as alumina, glass ceramics, and aluminum nitride.

Some radiator holes 5 are formed in the module substrates 2a and 2b, and the mother board 4. The radiator holes 5 pass through the module substrates 2a and 2b, and the mother board 4. It is preferable that the inside wall of the radiator hole 5 is plated with the metals having high thermal conductivity such as copper, gold, and silver. In addition, it is also preferable that the radiator hole is filled with the metals having high thermal conductivity, or the resins containing metals having high thermal conductivity or ceramics. For example, it is preferable that the diameter of the radiator holes 5 is in a range of 0.3 mm to 0.5 mm. The radiator holes 5 are formed at locations at which the semiconductor chips 1a and 1b are mounted on the module substrates 2a and 2b at intervals of 1 mm, for example. In addition, the radiator holds 5 are also formed at location at which the semiconductor chip 1b is above the mother board 4 at intervals of 1 mm, for example.

Moreover, heat conduction members 6 having high thermal conductivity are in the spaces between the semiconductor chip 1a and the module substrate 2b, and the semiconductor chip 1b and the mother board 4. For example, heat conduction members 6 are made of silicone containing metals having high thermal conductivity such as copper, or ceramics such as alumina and boron nitride. In addition heat conduction members 6 are also made of the resins having low elasticity, or materials having flexibility such as rubber. When the temperature of the semiconductor chips 1a and 1b, the module substrates 2a and 2b, and the mother board 4 rises, the stress is generated in these members by differences in their coefficients of thermal expansion. Not only does heat conduction member 6 improve heat conductivity of the stacked semiconductor device, but it also relieves this stress.

When the difference between the coefficients of thermal expansion of the semiconductor chips 1a and 1b, the module substrates 2a and 2b, and the mother board 4 is small, heat conduction member 6 can be made of the metals having high thermal conductivity such as copper, alumina, or thermosetting resins containing ceramics such as boron nitride, or carbon. That is, when it is not necessary to relieve the stress generated in the semiconductor device, heat conduction member 6 can be made of these materials. In the stacked semiconductor device shown in FIG. 1, heat conduction member 6 is provided in the spaces between the modules, and the module and the mother board 4 as explained above. However, it is not necessary to provide a heat conduction member 6 in these spaces. That is, the semiconductor chip 1a can directly contact the module substrate 2b, and the semiconductor chip 1b can also directly contact the mother board 4. In this case, heat dissipation effect may be lower.

Moreover, the radiator plate 7 is provided to the mother board 4. For example, the radiator plate 7 is made of materials having high thermal conductivity such as copper, and aluminum.

Heat conduction courses in the stacked semiconductor device shown in FIG. 1 are explained as follows.

When the semiconductor chip 1a is operated, heat is generated in the semiconductor chip 1a. A part of heat is conducted to the lower surface of the module substrate 2a, that is, to the surface of the module substrate 2a to which the semiconductor chip 1a contacts the module substrate 2a. Heat is diffused in the module substrate 2a, and dissipated. Another part of heat is conducted to heat conduction member 6 and then to the top surface of the module substrate 2b. Most of heat conducted to the surface of the module substrate 2b is conducted to the radiator holes 5 formed in the module substrate 2b, and then to the semiconductor chip 1b. After that, heat is conducted to heat conduction member 6 and to the surface of the mother board 4. Then, most of heat conducted to the surface of the mother board 4 is conducted to the radiator holes 5 formed in the mother board 4, and to the radiator plate 7. Heat conducted to the radiator plate 7 is dissipated.

In contrast, when the semiconductor chip 1b is operated, heat is generated in the semiconductor chip 1b. A part of heat is conducted to the lower surface of the module substrate 2b. Most of heat conducted to the lower surface of the module substrate 2b is conducted to the radiator holes 5 formed in the module substrate 2b. Heat is conducted to the opposite surface (top surface) of the module substrate 2b. After that, heat is conducted to the semiconductor chip 1a via heat conduction member 6. Then, heat is conducted to the lower surface of the module substrate 2a. Heat conducted to the lower surface of the module substrate 2a is diffused in the module substrate 2a and is dissipated. In contrast, another part of heat generated in the semiconductor chip 1b is conducted to the top surface of the mother board 4, via heat conduction member 6. Heat is diffused in the mother board 4, and most of heat is conducted to the radiator plate 7, via the radiator holes 5 formed in the mother board 4. Then heat conducted to the radiator plate 7 is dissipated.

FIG. 1 shows a stacked semiconductor device comprising two modules. However, the above special structures for heat dissipation are not limited to a stacked semiconductor device comprising two modules, and can be applied to the stacked semiconductor devices comprising two or more modules. In addition, the module-stacked bodies are mounted on the one surface of the mother board 4 in the stacked semiconductor device shown in FIG. 1. However, the module-stacked bodies can be mounted on the both surfaces of the mother board 4. When the module-stacked bodies are mounted on the both surfaces of the mother board 4, the radiator plate may not be provided.

Figure 2:
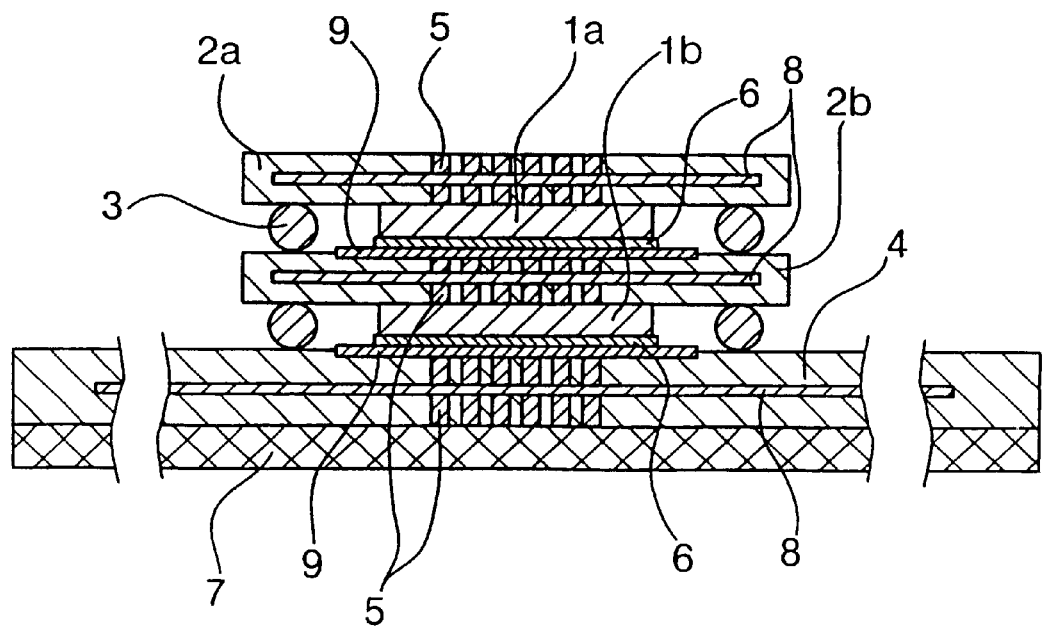
FIG. 2 is a cross-sectional view showing the second preferred embodiment of a stacked semiconductor device of the present invention.

FIG. 2 shows the second preferred embodiment of the stacked semiconductor device of the present invention. The stacked semiconductor device shown in FIG. 2 comprises the thermal diffusion layer 8 which is provided in the module substrates 2a and 2b, and the mother board 4. The thermal diffusion layer 8 is made of materials having high thermal conductivity such as copper. The thermal diffusion layer 8 widely diffuses heat in the module substrates 2a and 2b, and the mother board 4. The thermal diffusion layer 8 can improve heat dissipation of the stacked semiconductor device. Moreover, only one thermal diffusion layer 8 is provided in each of the module substrates 2a and 2b in the stacked semiconductor device shown in FIG. 2. However, two or more thermal diffusion layers can be provided in each of the module substrates 2a and 2b In addition, the stacked semiconductor device comprises thermal diffusion pattern 9 which is made of materials having high thermal conductivity such as copper. The thermal diffusion pattern 9 is provided in the top surfaces of the module substrate 2b and the mother board 4. The thermal diffusion pattern 9 is made of materials having high thermal conductivity such as copper. The thermal diffusion pattern 9 diffuses heat conducted from heat conduction member 6 on the surfaces of the module substrate 2b and the mother board 4. Most of the diffused heat is conducted to the radiator holes 5 which face to the thermal diffusion pattern 9.

The thermal diffusion layer 8 and the thermal diffusion pattern 9 improve the thermal diffusion of the stacked semiconductor device.

Figure 3:
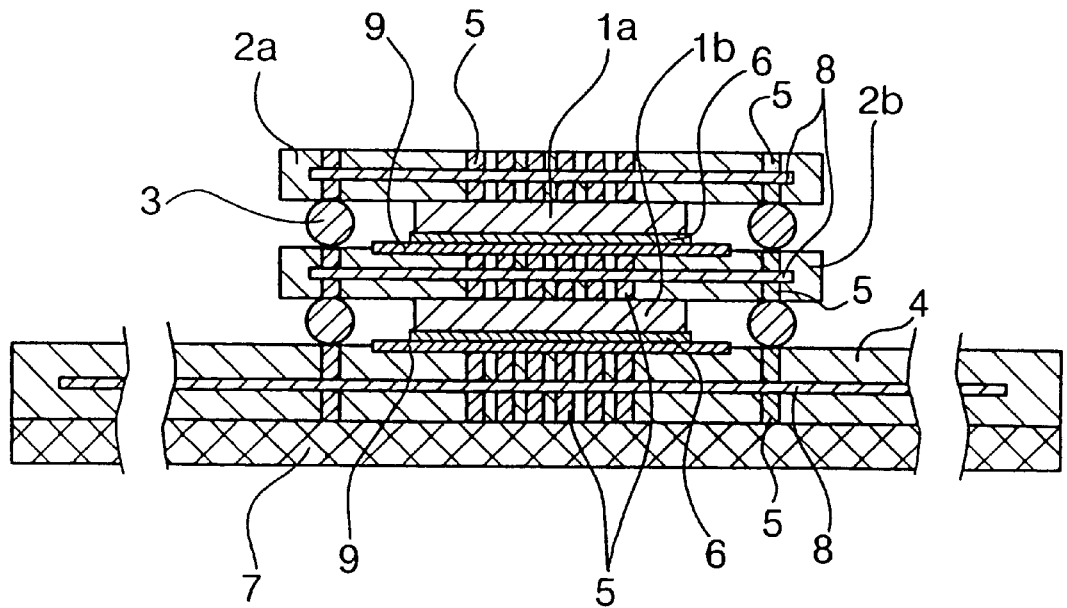
FIG. 3 is a cross-sectional view showing the third preferred embodiment of a stacked semiconductor device of the present invention.

FIG. 3 shows the third preferred embodiment of the stacked semiconductor device of the present invention. The stacked semiconductor device comprises the radiator hole 5 which faces to the connector (solder ball) 3, in addition to the radiator holes 5 shown in FIG. 2. In particular, the solder ball 3 contacting the radiator holes 5 does not electrically connect the module-stacked bodies. That is, the solder ball 3 for heat dissipation is provided in the stacked semiconductor device, in addition to the solder ball 3 for electrical connection. Heat conducted to the radiator hole 5 formed in the module substrate 2b is easily conducted to the solder ball 3 for heat dissipation. Then, a part of heat is conducted to the module substrate 2a. Another part of heat is conducted to the radiator plate 7, via the radiator hole 5 formed in the mother board 4. The radiator hole 5 facing to the solder ball 3 for heat dissipation can improve the thermal dissipation of the stacked semiconductor device.

Figure 4:
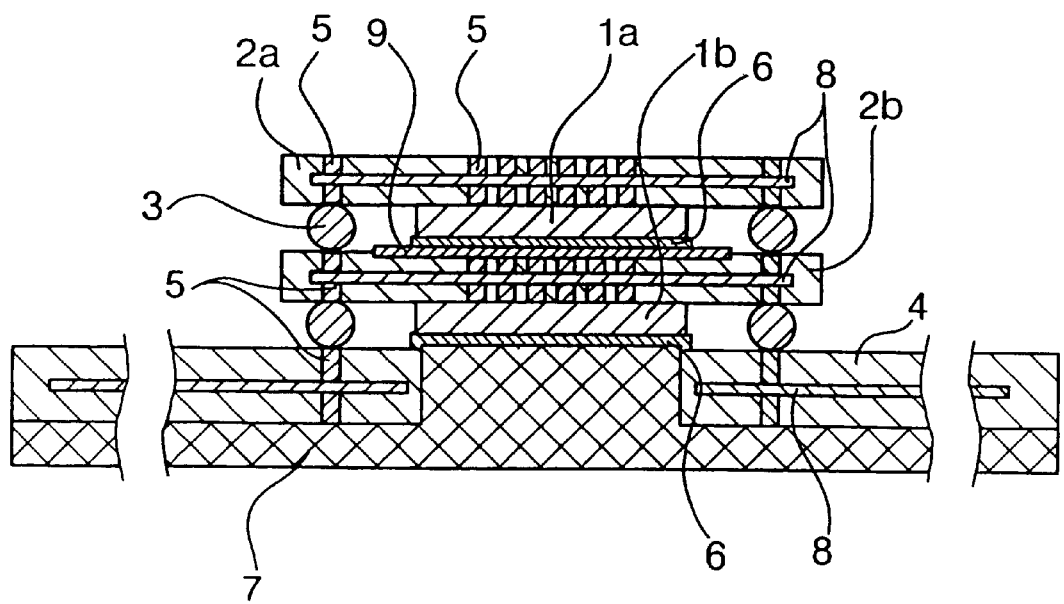
FIG. 4 is a cross-sectional view showing the forth preferred embodiment of a stacked semiconductor device of the present invention.

FIG. 4 shows the fourth preferred embodiment of the stacked semiconductor device of the present invention. In the stacked semiconductor device, the mother board 4 does not extend to the location below which the semiconductor chip 1b is located. The radiator is provided at this location, in addition to the lower surface of the mother board 4, whereby a radiator plate is formed. The radiator plate 7 directly contacts the heat conduction member 6. Therefore, the radiator plate 7 can improve the thermal dissipation of the stacked semiconductor device.

FIGS. 5 to 8 show the fifth to the eighth preferred embodiments of the stacked semiconductor device of the present invention. These stacked semiconductor devices are similar to those shown in FIGS. 1 to 4. As explained above, these stacked semiconductor devices as shown in FIGS. 5 to 8 have the different stacking orders of the module substrate and the semiconductor chip, compared with the stacked semiconductor devices shown in FIGS. 1 to 4.

Figure 5:
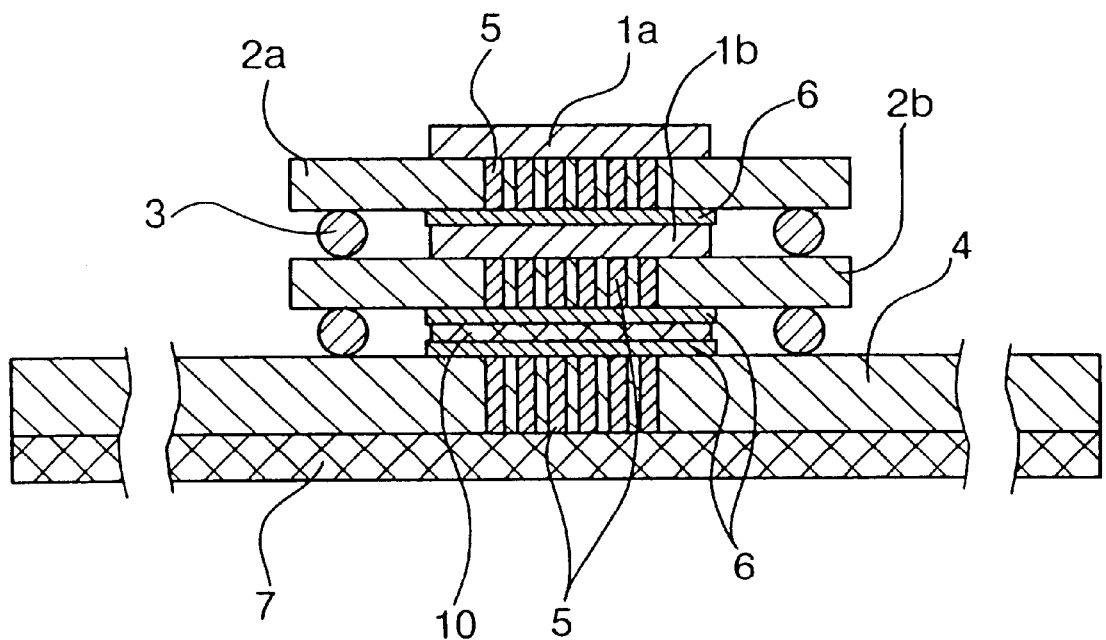
FIG. 5 is a cross-sectional view showing the fifth preferred embodiment of a stacked semiconductor device of the present invention.
Figure 6:
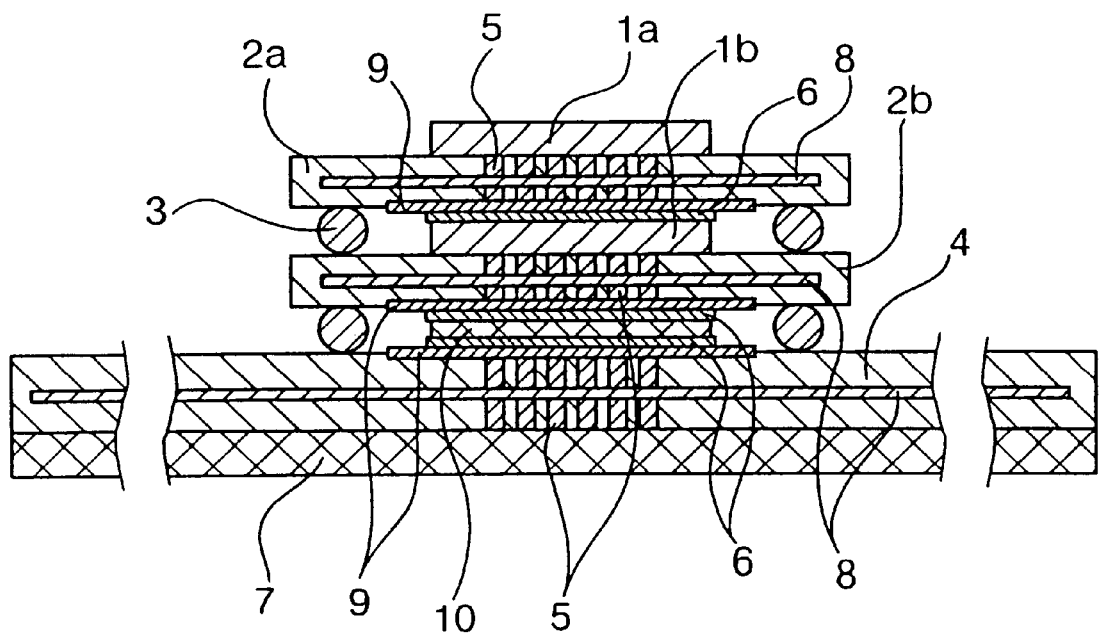
FIG. 6 is a cross-sectional view showing the sixth preferred embodiment of a stacked semiconductor device of the present invention.
Figure 7:
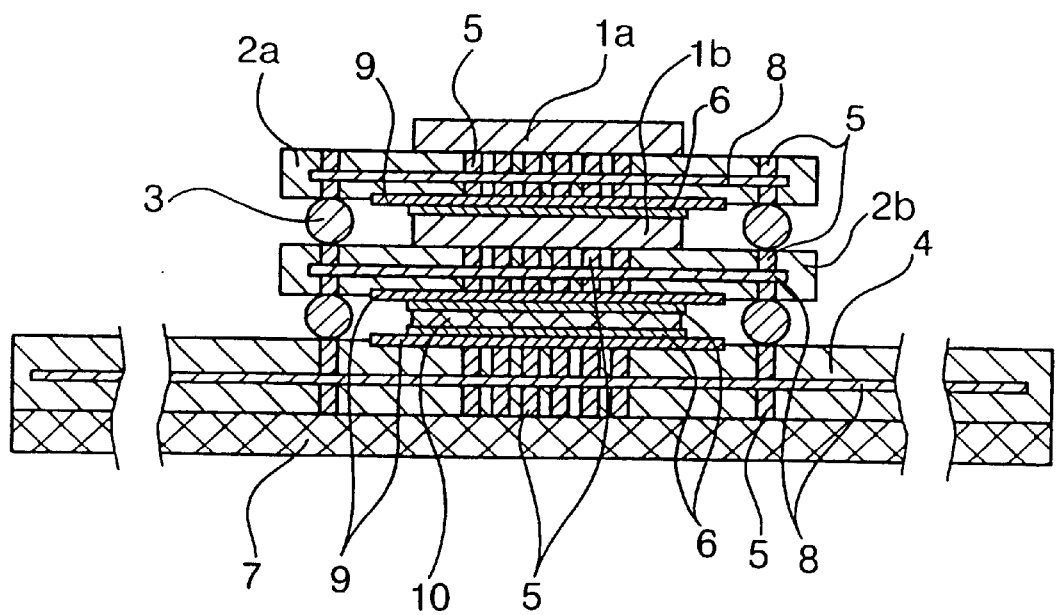
FIG. 7 is a cross-sectional view showing the seventh preferred embodiment of a stacked semiconductor device of the present invention.

The stacked semiconductor devices shown in FIGS. 5 to 7 comprise the heat conduction plate 10 made of materials having high thermal conductivity such as copper, and aluminum. The heat conduction plate 10 is provided in the space between the heat conduction member 6 provided on the lower surface of the module substrate 2b and the heat conduction member 6 provided on the top surface of the mother board 4.

In the stacked semiconductor device shown in FIG. 5, a part of heat in the module substrate 2b is conducted to the heat conduction member 6 which is provided to the lower surface of the module substrate 2b. Then heat is conducted to the heat conduction plate 10, and to the heat conduction member 6 on the top surface of the other board 4. After that, heat is conducted to the radiator holes 5 formed in the mother board 4, to the radiator plate 7, and dissipated.

In the stacked semiconductor device shown in FIG. 6, a part of heat in the module substrate 2b is conducted to the heat diffusion pattern 9 which is provided on the lower surface of the module substrate 2b. Then heat is conducted to the heat conduction member 6, the heat conduction plate 10, and to the beat conduction member 6 and the heat diffusion pattern 9 which are on the top surface of the mother board 4. After that, heat is conducted to the radiator holes 5 formed in the mother board 4, to the radiator plate 7, and dissipated.

In the stacked semiconductor device shown in FIG. 7, a part of heat in the module substrate 2b is conducted to the solder ball 3 for heat dissipation, and to the module substrate 2a or the mother board 4 as explained above. Another part of heat in the module substrate 2b is conducted to the heat diffusion pattern 9 which is provided on the lower surface of the module substrate 2b. Then heat is conducted to the heat conduction member 6, the heat conduction plate 10, the heat conduction member 6, and the heat diffusion pattern 9 on the top surface of the mother board 4. After that, heat is conducted to the radiator holes 5 formed in the mother board 4, to the radiator plate 7, and dissipated.

Figure 8:
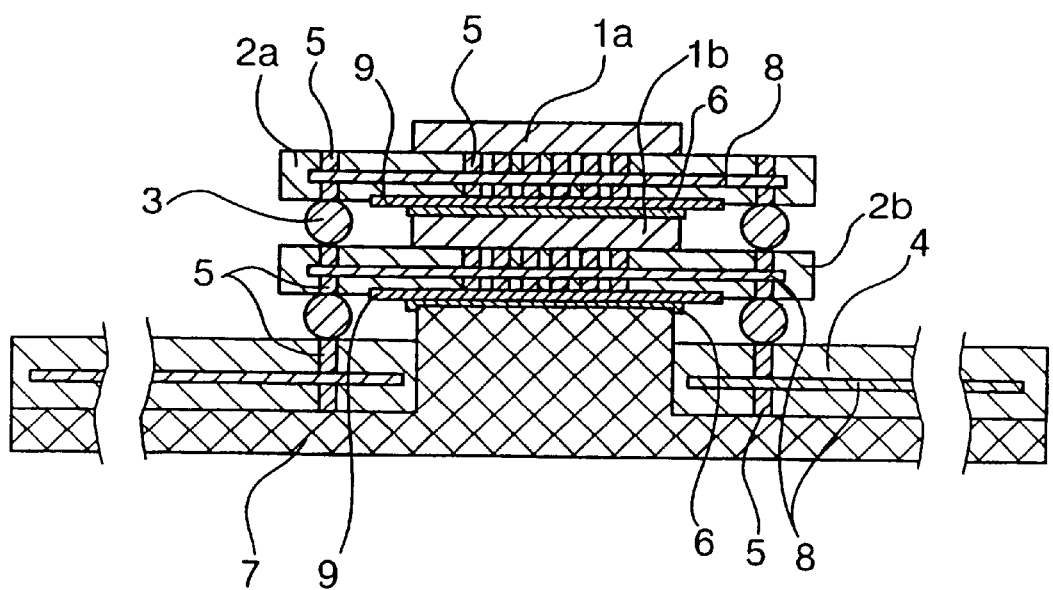
FIG. 8 is a cross-sectional view showing the eighth preferred embodiment of a stacked semiconductor device of the present invention.

In the stacked semiconductor device shown in FIG. 8, the mother board 4 does not extend to the location below which the semiconductor chip 1b located. The radiator is provided at this location, in addition to the lower surface of the mother board 4, whereby a radiator plate 7 is formed . The radiator plate 7 directly contacts the heat conduction member 6 which is on the lower surface of the module substrate 2b.

As explained above, the stacked semiconductor device of the present invention can diffuse heat generated by the semiconductor chip in the module substrate, other semiconductor chips, the mother board, and the radiator plate. Therefore, the stacked semiconductor device of the present invention can prevent needless increases in the temperature of an operating semiconductor chip.

EXAMPLE 1

The stacked semiconductor device shown in FIG. 1 was prepared.

COMPARATIVE EXAMPLE 1

Figure 9:
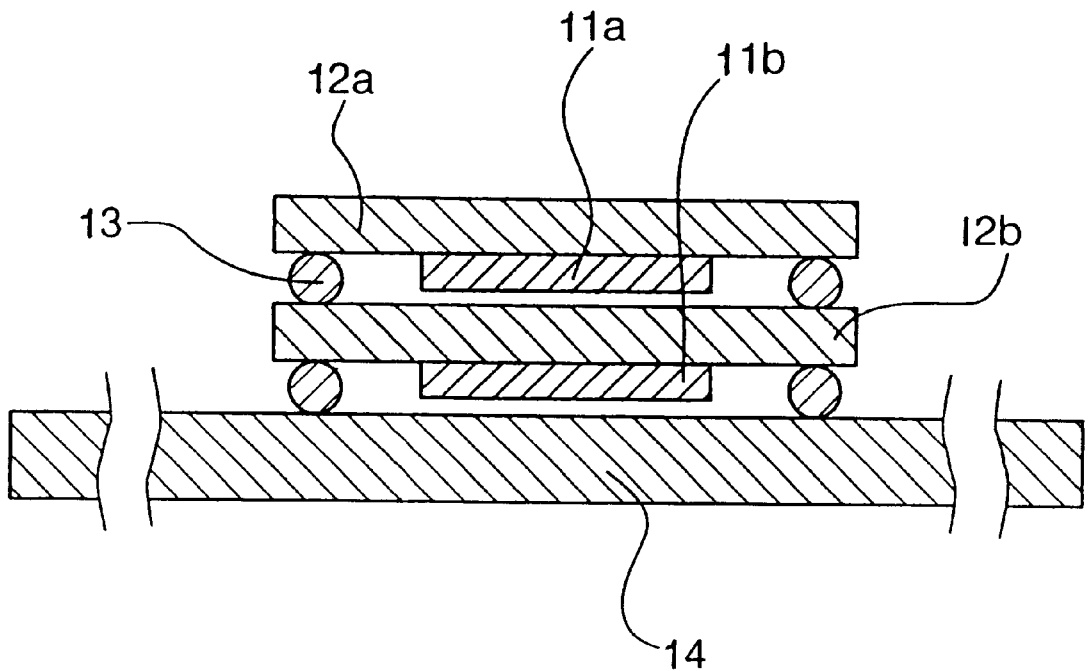
FIG. 9 is a cross-sectional view showing an ordinary stacked semiconductor device.
Figure 10:
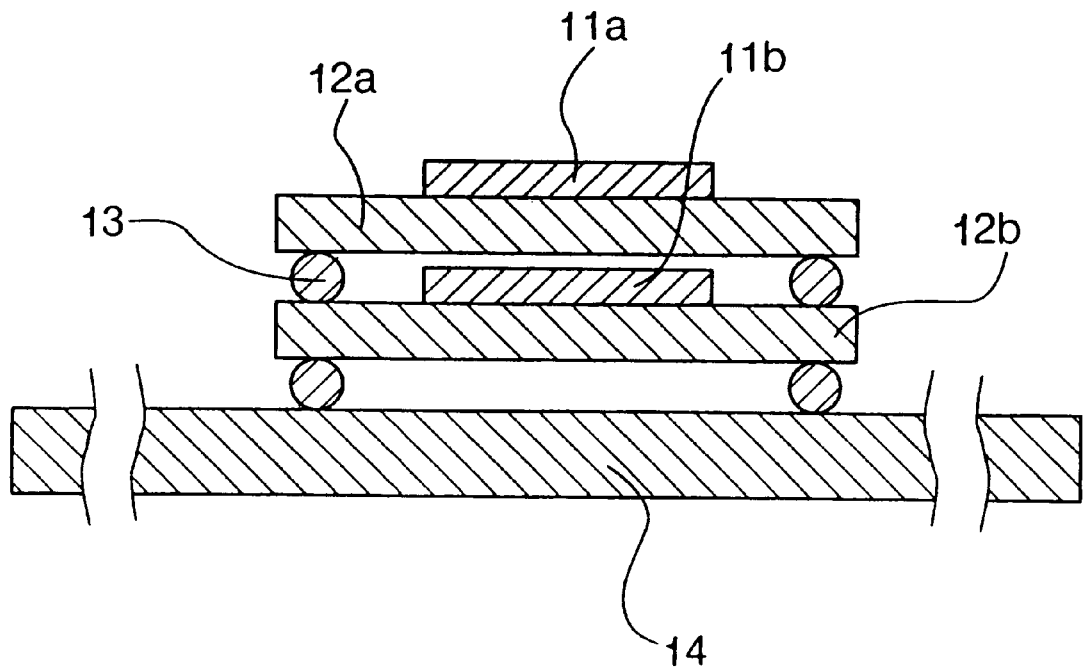
FIG. 10 is a cross-sectional view showing another ordinary stacked semiconductor device.

A comparative stacked semiconductor device shown in FIG. 9 was prepared.

COMPARATIVE EXAMPLE 2

A comparative stacked semiconductor device was prepared which has identical structures to those shown in FIG. 9, except that the semiconductor chip 11a contacts the module substrate 12b.

Then, the prepared stacked semiconductor devices in the Example 1 and the Comparative Examples 1 and 2 were operated. The temperatures of the semiconductor chips after operating were measured. The temperature of the semiconductor chip of the stacked semiconductor device of the Comparative Example 2 was lower than that of the semiconductor chip of the stacked semiconductor device of the Comparative Example 1 by 5° C. In addition, the temperature of the semiconductor chip of the stacked semiconductor device of the Example 1 was lower than that of the semiconductor chip of the stacked semiconductor device of the Comparative Example 2 by 15° C. That is, the temperature of the semiconductor chip of the stacked semiconductor device of the Example 1 was lower than that of the semiconductor chip of the stacked semiconductor device of the Comparative Example 1 by 20° C.

What is claimed is:

1. A stacked semiconductor device comprising a mother board and a module-stacked body mounted on the mother board, the module-stacked body comprising two or more stacked modules each of which comprises a module substrate and a semiconductor chip mounted on the module substrate, wherein at least one radiator hole is formed in each of the module substrates and the mother board so that the radiator hole formed in at least one of the module substrates faces to the semiconductor chip.

2. A stacked semiconductor device according to claim 1, wherein a heat conduction member is in spaces between the module substrates, and the module substrate and the mother board, and the radiator hole formed in the module substrate and the mother board faces the heat conduction member or the semiconductor chip.

3. A stacked semiconductor device according to claim 1, wherein a heat dissipation layer is formed in the module substrates and the mother board, and a heat diffusion pattern is formed at location at which the semiconductor chips is mounted on the module substrate and the mother board.

4. A stacked semiconductor device according to claim 1, wherein the radiator hole is formed so that the radiator hole face to at least one connector or heat dissipation which mechanically connects the module substrates, and the module substrate and the mother board.

5. A stacked semiconductor device according to claim 1, wherein a radiator plate is provided on the lower surface of the mother board, the heat conduction member is provided onto the mother board, and the radiator hole faces the radiator plate and the heat conduction member.

6. A stacked semiconductor device according to claim 1, wherein the inside wall of the radiator hole is plated with at least one metal selected from the group consisting of copper, gold, and silver.

7. A stacked semiconductor device according to claim 1, wherein the radiator hole is filled with at least one metal selected from the group consisting of metals having high thermal conductivity, and resins containing metals having high thermal conductivity or ceramics.

8. A stacked semiconductor device according to claim 1, wherein the heat conduction member is made of silicone containing one material selected from the group consisting of copper, alumina, and boron nitride.

9. A stacked semiconductor device according to claim 1, wherein the heat conduction member is made of resin having low elasticity.

10. A stacked semiconductor device according to claim 1, wherein the heat conduction member is made of rubber.

* * * * *